(12) United States Patent
Park et al.

(10) Patent No.: US 8,804,417 B2
(45) Date of Patent: Aug. 12, 2014

(54) NONVOLATILE MEMORY DEVICE INCLUDING DUMMY MEMORY CELL AND PROGRAM METHOD THEREOF

(75) Inventors: Chan Park, Gwangju (KR); Changseok Kang, Seongnam-si (KR); Sung-Il Chang, Hwaseong-si (KR); Byeong-In Choe, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 20 days.

(21) Appl. No.: 13/157,343

(22) Filed: Jun. 10, 2011

(65) Prior Publication Data

US 2011/0305079 A1 Dec. 15, 2011

(30) Foreign Application Priority Data

Jun. 11, 2010 (KR) ........................ 10-2010-0055561

(51) Int. Cl.
*G11C 16/04* (2006.01)
*G11C 16/06* (2006.01)
*G11C 16/08* (2006.01)
*G11C 16/10* (2006.01)
*G11C 16/12* (2006.01)
*G11C 16/22* (2006.01)

(52) U.S. Cl.
USPC ............ 365/185.02; 365/185.17; 365/185.18; 365/185.23; 365/185.24; 365/185.28

(58) Field of Classification Search
USPC .............. 365/185.02, 185.17, 185.18, 185.2, 365/185.23, 185.24, 185.28
See application file for complete search history.

(56) References Cited

U.S. PATENT DOCUMENTS

| | | | |
|---|---|---|---|
| 2004/0113199 A1* | 6/2004 | Hazama et al. | 257/317 |
| 2007/0236990 A1* | 10/2007 | Aritome | 365/185.01 |
| 2007/0253253 A1* | 11/2007 | Aritome | 365/185.17 |
| 2009/0003067 A1* | 1/2009 | Kang et al. | 365/185.13 |
| 2009/0180317 A1 | 7/2009 | Kang et al. | |

FOREIGN PATENT DOCUMENTS

| | | |
|---|---|---|
| JP | 2006-186359 | 7/2006 |
| KR | 1020060060528 A | 6/2006 |
| KR | 1020070018216 A | 2/2007 |
| KR | 1020090110605 A | 10/2009 |

* cited by examiner

*Primary Examiner* — J. H. Hur
(74) *Attorney, Agent, or Firm* — Volentine & Whitt, PLLC

(57) ABSTRACT

A nonvolatile memory device including a dummy memory cell and a method of programming the same, wherein the nonvolatile memory device includes a dummy memory cell, and a plurality of memory cells serially connected to the dummy memory cell. The nonvolatile memory device sets a voltage provided to the dummy memory cell according to a distance between a selected memory cell among the plurality of memory cells and the dummy memory cell when a program operation is performed.

5 Claims, 17 Drawing Sheets

NONVOLATILE MEMORY DEVICE INCLUDING DUMMY MEMORY CELL AND PROGRAM METHOD THEREOF

CROSS-REFERENCE TO RELATED APPLICATIONS

A claim of priority under 35 U.S.C. §119 is made to Korean Patent Application No. 10-2010-0055561, filed on Jun. 11, 2010, the entire contents of which are hereby incorporated by reference.

BACKGROUND

The inventive concepts described herein are generally related to a nonvolatile memory device, and more particularly, to a nonvolatile memory device including a dummy memory cell and a method of programming the same.

Volatile memory devices such as a DRAM, a SRAM, etc. and nonvolatile memory devices such as an EEPROM, a FRAM, a PRAM, a MRAM, a flash memory, etc. as used in semiconductor memory devices for example, lose stored data when the power supply is interrupted. In contrast, nonvolatile memory devices maintain stored data when the power supply is interrupted.

The types of devices which use nonvolatile memory devices are increasing. For example, MP3 players, digital cameras, cell phones, camcorders, flash cards and solid state disks (SSD) use nonvolatile memory devices as storage devices.

As the number of devices using nonvolatile memory device as storage devices increases, there is a need to increase the storage capacity of nonvolatile memory devices. To meet the need of increased storage capacity in nonvolatile memory devices, a study for developing a highly integrated nonvolatile memory is actively being performed. In such a highly integrated nonvolatile memory device, a disturbance phenomenon may occur whereby an unselected memory cell adjacent to the selected memory cell may be programmed when a program operation is performed. Thus, there is a need for a technology that can prevent such a disturbance phenomenon.

SUMMARY

In an example embodiment of the inventive concept, a nonvolatile memory device having a string structure includes a dummy memory cell; and a plurality of memory cells serially connected to the dummy memory cell, wherein a voltage applied to the dummy memory cell during a programming operation is set according to a distance between the dummy memory cell and a memory cell selected from the plurality of memory cells for programming.

In another example embodiment of the inventive concept, a nonvolatile memory device includes a ground select transistor; a dummy memory cell serially connected to the ground select transistor and configured to receive a disturbance prevention voltage through a dummy word line; and first and second memory cells serially connected to the dummy memory cell and configured to form a channel according to voltages received via respective first and second word lines, wherein during a program operation, the disturbance prevention voltage applied to the dummy memory cell is set according to a distance between the dummy memory cell and a memory cell selected from the first and second memory cells for programming.

In a further example embodiment of the inventive concept, a nonvolatile memory device includes a plurality of memory cells configured to form a channel responsive to voltages received via respective word lines; a dummy memory cell serially connected between the ground select transistor and the plurality of memory cells, and configured to receive a disturbance prevention voltage via a dummy word line; a voltage generator configured to generate and apply the disturbance prevention voltage to the dummy memory cell via the dummy word line and the voltages to the plurality of memory cells via the respective word lines, the voltage generator preventing unselected memory cells from being programmed by setting the disturbance prevention voltage according to a distance between the dummy memory cell and a memory cell selected for programming.

BRIEF DESCRIPTION OF THE DRAWINGS

The accompanying drawings are included to provide a further understanding of the embodiment of the inventive concept, and are incorporated in and constitute a part of this specification. The drawings illustrate exemplary embodiments of the inventive concept and, together with the description, serve to explain principles of the inventive concept, whereby.

DETAILED DESCRIPTION OF THE EMBODIMENTS

Example embodiments of the inventive concept will now be described below in more detail with reference to the accompanying drawings. The embodiments of the inventive concept may, however, be embodied in different forms and should not be construed as limited to the example embodiments set forth herein. Rather, these example embodiments are provided so that this disclosure will be thorough and complete, and will fully convey the scope of the inventive concept to those skilled in the art. Like numbers refer to like elements throughout.

Figure 1:
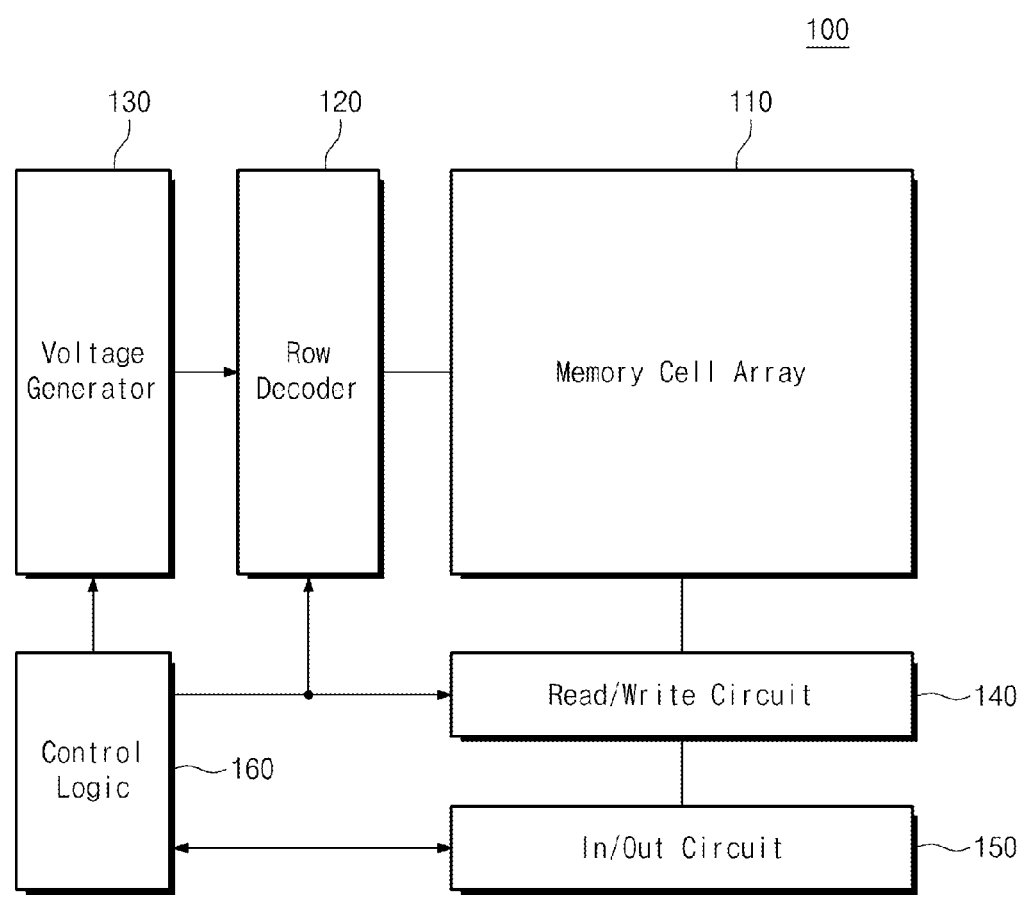
FIG. 1 is a block diagram illustrating a nonvolatile memory device in accordance with an example embodiment of the inventive concept.

FIG. 1 is a block diagram illustrating a nonvolatile memory device in accordance with an example embodiment of the inventive concept. Referring to FIG. 1, a nonvolatile memory device 100 may include a memory cell array 110, a row decoder 120, a voltage generator 130, a read/write circuit 140, an input/output circuit 150 and control logic 160.

The memory cell array 110 may include a plurality of memory cells. Each memory cell stores data transferred from the read/write circuit 140. For example, each memory cell can store one bit. Each memory cell can store two or more bits. Each memory cell is connected to the row decoder 120 through a word line (WL).

The row decoder 120 is controlled by the control logic 160. The row decoder 120 may select and drive rows of the memory cell array 110. For example, the row decoder 120 may be configured to drive rows of the memory cell array 110 using not only a positive high voltage but also a negative high voltage.

The voltage generator 130 is controlled by the control logic 160 and is configured to generate voltages to be provided to the memory cell array 110. For example, the voltage generator 130 may generate a program voltage (Vpgm) for programming a selected memory cell, a read voltage for reading data stored in a selected page, and a disturbance prevention voltage Vd for preventing a program disturbance.

The read/write circuit 140 is controlled by the control logic 160. The read/write circuit 140 may be configured to drive bit lines (BL) of the memory cell array 110 using a bit line program inhibition voltage or a bit line program voltage according to a state of data to be programmed. For example, the bit line program inhibition voltage may be a power supply voltage in some instances. In other instances, the bit line program inhibition voltage may also be a ground voltage. Also, the read/write circuit 140 may be configured to read data from selected memory cells of the memory cell array 110 when a read operation is performed.

The input/output circuit 150 is controlled by the control logic 160. The input/output circuit 150 may be configured to interface data between the read/write circuit 140 and an external device. The control logic 160 may be configured to control an overall operation of the nonvolatile memory device 100.

The nonvolatile memory device in accordance with an example embodiment of the inventive concept may prevent an unselected memory cell from being programmed by providing a disturbance inhibition voltage Vd to a dummy word line (DWL). In particular, when a program operation is performed, the nonvolatile memory device in accordance with example embodiments of the inventive concept may properly control a level of the disturbance inhibition voltage Vd provided to the dummy word line (DWL) according to a position of a selected memory cell.

For example, when a program operation is performed, in the case that a selected word line and a dummy word line (DWL) are adjacent to each other, a high disturbance prevention voltage is provided to the dummy word line (DWL). In this case, the high disturbance prevention voltage may be at least a voltage level that can form a channel. In another example, when a program operation is performed, in the case that a selected word line and a dummy word line (DWL) are spaced apart from each other, a low disturbance prevention voltage is provided to the dummy word line (DWL). In this case, the low disturbance prevention voltage may be a voltage level that can turn off a dummy memory cell.

Figure 2:
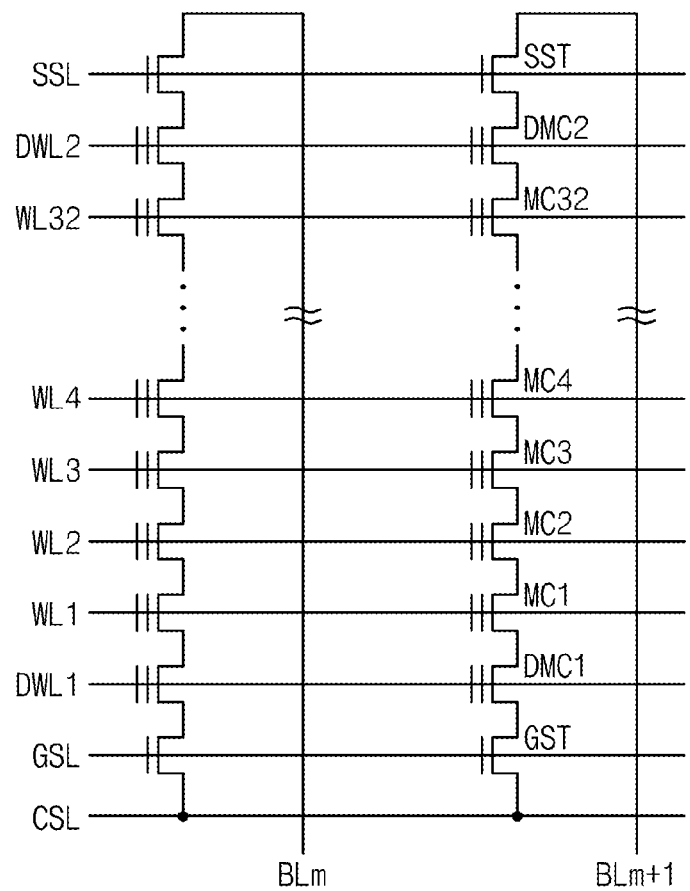
FIG. 2 is a circuit diagram illustrating a memory cell array of FIG. 1.

FIG. 2 is a circuit diagram illustrating the memory cell array 110 of FIG. 1. The memory cell array 110 may be comprised of a plurality of blocks. In FIG. 2, a configuration of one memory block among a plurality of blocks is illustrated as an illustrative example. For a brief description, it is assumed that a memory block is constituted by a flash memory and includes 32 word lines and 2 dummy word lines.

Referring to FIG. 2, a plurality of memory cells is serially connected between a string select transistor (SST) and a ground select transistor (GST). As an illustration, it is assumed that the plurality of memory cells includes 2 dummy memory cells (DMC) and 32 memory cells (MC).

For example, it is assumed that a first dummy memory cell (DMC1) is disposed between the ground select transistor (GST) and a first memory cell (MC1). It is assumed that a second dummy memory cell (DMC2) is disposed between the string select transistor (SST) and a 32th memory cell (MC32). The string select transistor (SST), the ground select transistor (GST), and the dummy memory cells (DMC1, DMC2) and the memory cells (MC1-MC32) disposed between the string select transistor (SST) and the ground select transistor (GST) may be called a string. The first and second dummy memory cells (DMC1, DMC2) are connected to first and second dummy word lines (DWL1, DWL2), respectively. The 1st through 32nd memory cells (MC1-MC32) are connected to 1st through 32nd word lines (WL1-WL32), respectively.

A channel boosting scheme is used as a method for programming a selected memory cell and preventing an unselected memory cell located at a same word line from being programmed. The channel boosting scheme boosts a channel voltage by providing a power supply voltage Vcc to a gate and a drain of a string select transistor (SST) of an unselected string and providing a ground voltage 0V to a gate of a ground select transistor (GST) of an unselected string. Thus, a potential difference between a floating gate and a channel of an unselected memory cell is made to be lower than a potential difference at which F-N tunneling occurs. For example, the channel boosting method includes a self boosting scheme and a local boosting scheme.

However, in the case of applying a channel boosting scheme when a program operation is performed, a disturbance due to a hot carrier may occur because of the difference of a voltage provided to each word line. This phenomenon may be different according to a location of a selected word line in the case that a program voltage is provided to a selected word line among a plurality of word lines WL1-WL32.

Thus, the nonvolatile memory device may prevent a disturbance due to a hot carrier by providing a different disturbance prevention voltage Vd to a dummy word line (DWL)

according to a location of a selected word line. An example embodiment of the inventive concept for preventing a disturbance due to a hot carrier when a dummy word line and a selected word line are adjacent to each other will be described with reference to FIGS. 3 and 4. An example embodiment of the inventive concept for preventing a disturbance due to a hot carrier when a dummy word line and a selected word line are spaced apart from each other will be described with reference to FIGS. 5 and 6.

Figure 3:
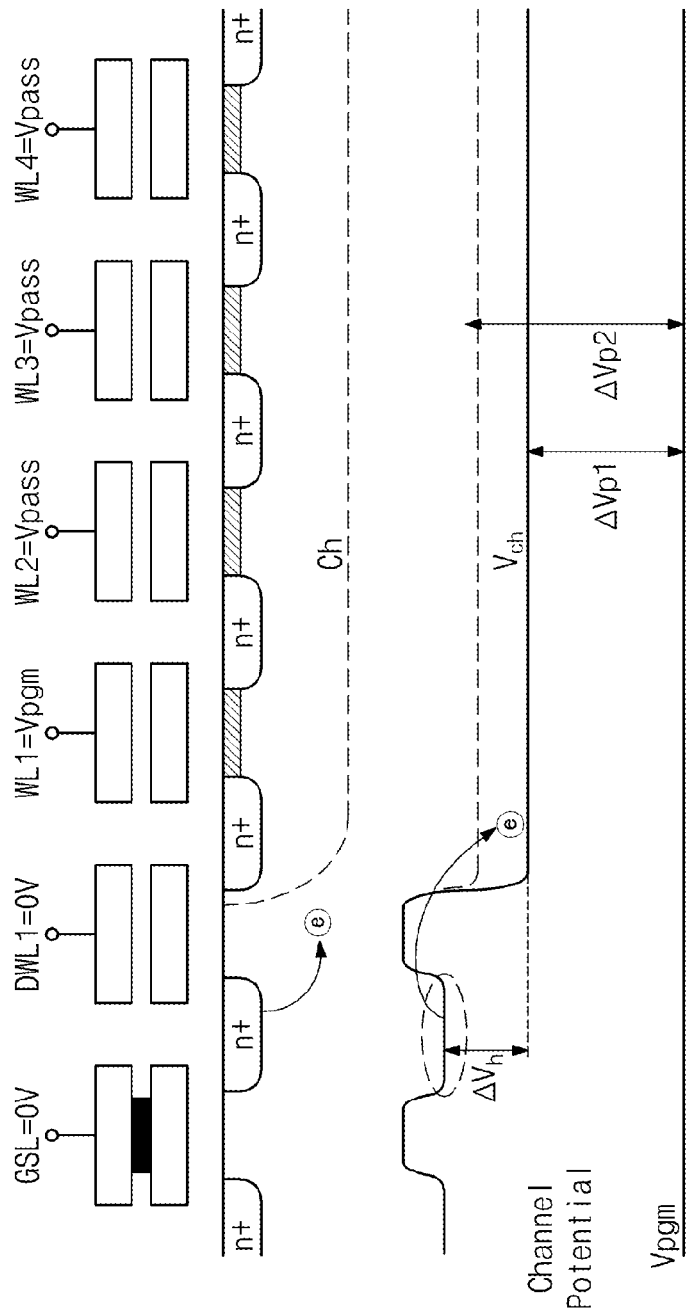
FIG. 3 is a drawing explaining a disturbance due to a hot carrier when a dummy word line and a selected word line are adjacent to each other.

Also, for convenience of description, hereinafter, example embodiments of the inventive concept will be described based on a local boosting scheme. FIG. 3 is a drawing explaining a disturbance due to a hot carrier when a dummy word line and a selected word line are adjacent to each other. In FIG. 3, it is assumed that a ground voltage 0V is provided to a first dummy word line (DWL1) and a program voltage Vpgm is provided to a first word line (WL1). In this case, it is assumed that a first memory cell (MC1) is a memory cell to be program-inhibited that shares the first word line (WL1) with a selected memory cell. Referring to FIG. 3, a ground voltage 0V is provided to a ground select line (GSL) and the first dummy word line (DWL1) and a program voltage Vpgm is provided to the first word line (WL1). A pass voltage Vpass is provided to second through fourth word lines (WL2-WL4). In this case, a power supply voltage Vcc is provided to a string select transistor (SST) corresponding to the first memory cell (MC1) to be program-inhibited and thereby a channel Ch is boosted.

If a channel is boosted, a potential difference occurs between a source and a drain of the first dummy memory cell (DMC1). For example, a potential difference ΔVh may occur between a source and a drain of the first dummy memory cell (DMC1). Due to a potential difference, a strong electric field is formed between a source and a drain of the first dummy memory cell (DMC1) and a hot electron is generated from the source.

A hot electron is accelerated in a drain direction and many electron-hole pairs are generated due to an avalanche phenomenon. In this case, because many electrons flow in a channel, a boosted channel voltage is lowered. Consequently, a potential difference between a floating gate and a channel of the first dummy memory cell (DMC1) increases from ΔVp1 to ΔVp2. Thus, due to a reduction of boosting efficiency, a program disturbance phenomenon occurs in the first memory cell (MC1) that should be program-inhibited and in the worst case, the first memory cell (MC1) is programmed. That is, a disturbance due to a hot carrier occurs.

Figure 4:
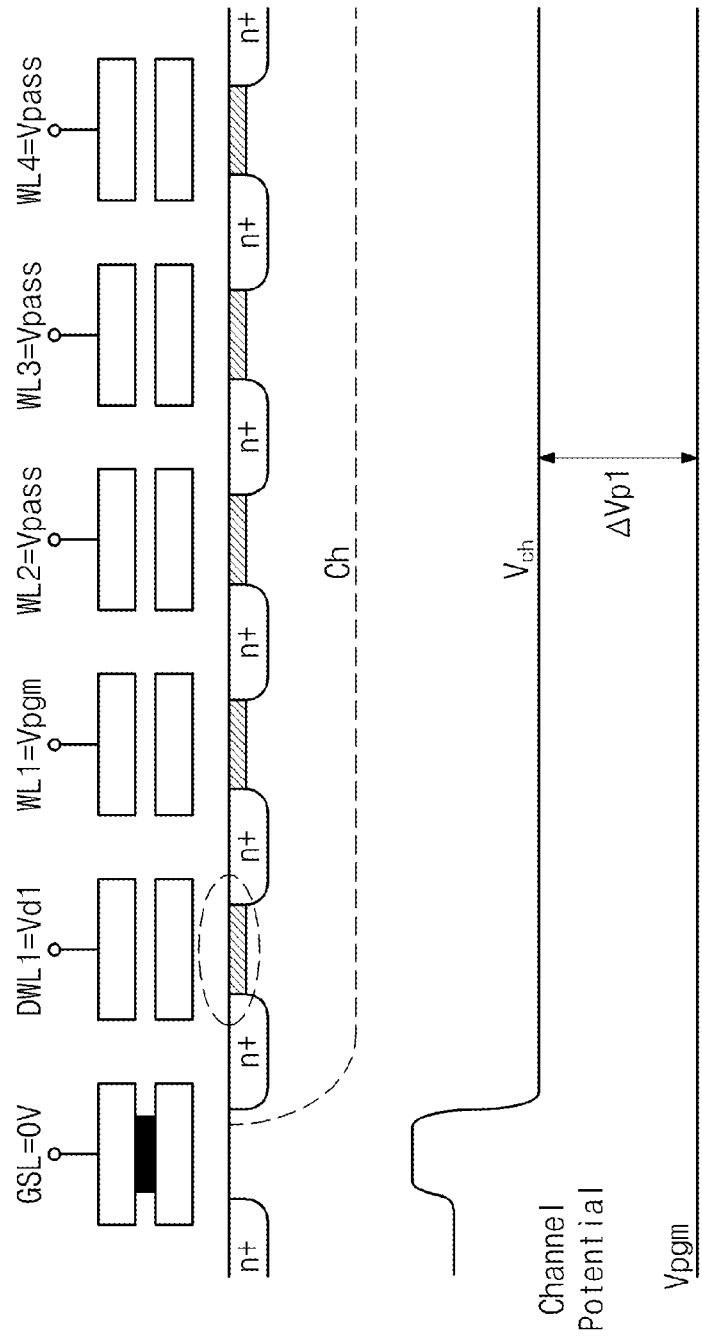
FIG. 4 is a drawing illustrating an example embodiment of the inventive concept to prevent a disturbance due to a hot carrier as described in FIG. 3.

FIG. 4 is a drawing illustrating an example embodiment of the inventive concept to prevent a disturbance due to a hot carrier of FIG. 3. For convenience of description, it is assumed that in FIG. 4, a program voltage Vpgm is provided to the first word line (WL1). In this case, it is assumed that the first memory cell (MC1) is a memory cell to be program-inhibited that shares the first word line (WL1) with a selected memory cell.

Referring to FIG. 4, a ground voltage 0V and a first disturbance prevention voltage Vd1 are provided to the ground select line (GSL) and the first dummy word line (DWL1), respectively. The program voltage Vpgm and the pass voltage Vpass are provided to the first word line (WL1) and the second through fourth word lines (WL2-WL4), respectively.

Unlike FIG. 3, the first disturbance prevention voltage Vd1 is provided to the first dummy word line (DWL1) of FIG. 4. This is to prevent a disturbance due to a hot carrier by forming a channel between a source and a drain of the first dummy word line (DWL1).

More specifically, the first disturbance prevention voltage Vd1 is provided to the first dummy word line (DWL1). Here, the first disturbance prevention voltage Vd1 is a voltage that can form a channel between a source and a drain of the first dummy word line (DWL1). For example, the first disturbance prevention voltage Vd1 is a voltage that turns on the first dummy memory cell (DMC1). The first disturbance prevention voltage Vd1 may be greater than a threshold voltage Vth of the first dummy memory cell (DMC1). The first disturbance prevention voltage Vd1 may be a pass voltage Vpass.

In this case, a channel is formed between a source and a drain of the first dummy word line (DWL1). Thus, a potential difference between a source and a drain of the first dummy word line (DWL1) does not exist. Consequently, since a potential difference between a floating gate and a channel of the first dummy memory cell (DMC1) maintains ΔVp1, a disturbance due to a hot carrier does not occur.

As described above, in the case that a dummy word line and a selected word line are adjacent to each other, the nonvolatile memory device in accordance with example embodiments of the inventive concept can prevent a disturbance due to a hot carrier by applying a voltage that can form a channel to the dummy word line.

In FIGS. 3 and 4, example embodiments of the inventive concept were described using the first dummy memory cell (DMC1) connected to a ground select transistor (GST). However, this is only an illustrative example and a same principle may be applied to a second dummy memory cell (DMC2) connected to a string select transistor (SST).

Figure 5:
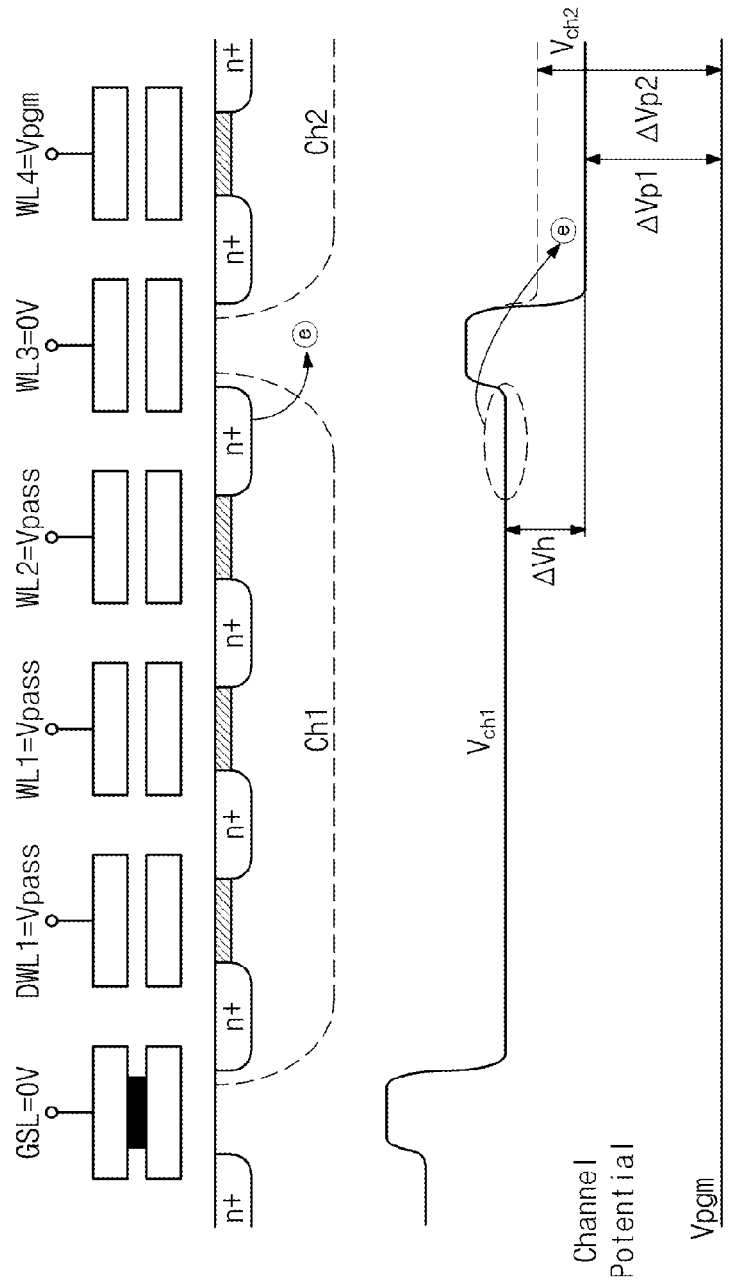
FIG. 5 is a drawing explaining a disturbance due to a hot carrier when a dummy word line is spaced apart from a selected word line.

FIG. 5 is a drawing explaining a disturbance due to a hot carrier when a dummy word line is spaced apart from a selected word line. It is assumed that in FIG. 5, a pass voltage Vpass is provided to a first dummy word line (DWL1) and a program voltage Vpgm is provided to a fourth word line (WL4). In this case, it is assumed that a fourth memory cell (MC4) is a memory cell to be program-inhibited that shares the fourth word line (WL4) with a selected memory cell. Also, it is assumed that a first channel Vch1 and a second channel Vch2 are formed by providing a ground voltage 0V to a third word line (WL3) using a local boosting scheme.

Referring to FIG. 5, a ground voltage 0V is provided to a ground select line (GSL) and the third word line (WL3). The pass voltage Vpass is provided to the first dummy word line (DWL1) and first and second word lines (WL1, WL2). Thus, the first channel Ch1 is boosted.

A ground voltage 0V is provided to the third word line (WL3) and the program voltage Vpgm is provided to the fourth word line (WL4). The second channel Ch2 is boosted by providing a power supply voltage Vcc to a string select transistor (SST) corresponding to the fourth memory cell (MC4) to be program-inhibited.

In this case, a first channel voltage Vch1 corresponding to a source of a third memory cell (MC3) is lower than a second channel voltage Vch2 corresponding to a drain of the third memory cell (MC3). This is because a channel of the fourth memory cell (MC4) sharing a drain with the third memory cell (MC3) is boosted by the program voltage Vpgm while a channel of a second memory cell (MC2) sharing a source with the third memory cell (MC3) is boosted by the pass voltage Vpass.

Thus, a potential difference may occur between a source and a drain of the third memory cell (MC3). Referring to FIG. 5, a potential difference ΔVh may occur between a source and a drain of the third memory cell (MC3). Due to a potential difference, a strong electric field is formed between a source and a drain of the third memory cell (MC3). Since a gate voltage of the third memory cell (MC3) is a ground voltage, electrons move from a source in a second channel Ch2 direction.

In this case, a hot carrier phenomenon may occur by electrons moved in a second channel direction and the second channel voltage Vch2 descends. Consequently, a potential difference between a floating gate and a channel of the third memory cell (MC3) increases from ΔVp1 to ΔVp2. If the increased potential difference ΔVp2 is greater than a potential difference at which F–N tunneling may occur, the fourth memory cell (MC4) that should be program-inhibited is programmed. That is, a disturbance due to a hot carrier may occur.

Figure 6:
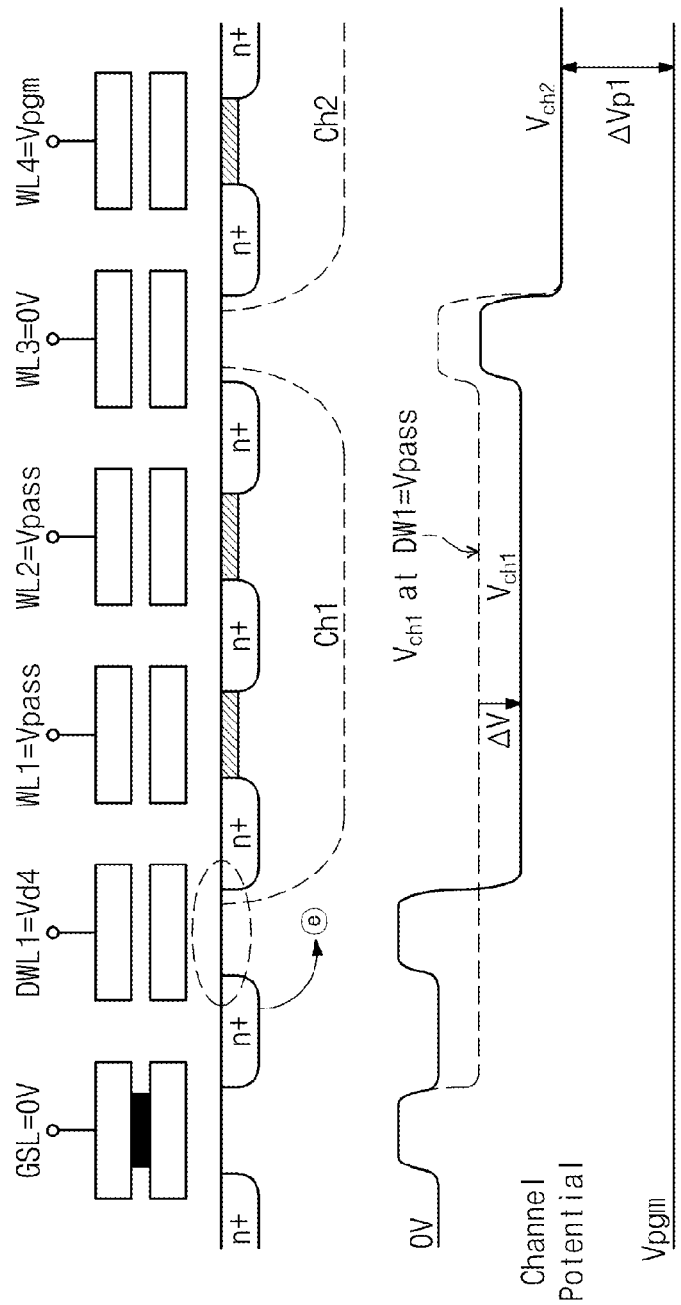
FIG. 6 is a drawing illustrating an embodiment of the inventive concept to prevent a disturbance due to a hot carrier described in FIG. 5.

FIG. 6 is a drawing illustrating an example embodiment of the inventive concept to prevent a disturbance due to a hot carrier of FIG. 5. For convenience of description, it is assumed that in FIG. 6, a ground voltage is provided to a third word line (WL3) and a program voltage Vpgm is provided to a fourth word line (WL4). In this case, it is assumed that a fourth memory cell (MC4) is a memory cell to be program-inhibited that shares the fourth word line (WL4) with a selected memory cell.

Referring to FIG. 6, a ground voltage and a fourth disturbance prevention voltage Vd4 are provided to a ground select line (GSL) and a first dummy word line (DWL1), respectively. This is to prevent a disturbance due to a hot carrier by blocking a formation of a channel between a source and a drain of a first dummy memory cell (DMC1).

More specifically, the fourth disturbance prevention voltage Vd4 is provided to the first dummy word line (DWL1). Here, the fourth disturbance prevention voltage Vd4 is a voltage for blocking a formation of a channel between a source and a drain of the first dummy memory cell (DMC1). For example, the fourth disturbance prevention voltage Vd4 may be a voltage turning off the first dummy memory cell (DMC1). The fourth disturbance prevention voltage Vd4 may be lower than a threshold voltage Vth of the first dummy memory cell (DMC1). The fourth disturbance prevention voltage Vd4 may be a ground voltage 0V.

In this case, a formation of a channel between a source and a drain of the first dummy memory cell (DMC1) is blocked. Thus, a length of a first channel Ch1 is shortened. This means that a capacity of capacitance of the first channel Ch1 decreases. Thus, an effect due to capacitance coupling increases and thereby a voltage of the first channel Ch1 rises. For instance, referring to FIG. 6, a voltage of the first channel Ch1 rises by ΔV.

Consequently, a potential difference between a floating gate of a second memory cell (MC2) and the first channel Ch1 is ΔVp1 and is similar to a potential difference between a floating gate of the fourth memory cell (MC4) and a second channel Ch2. Therefore, a disturbance due to a hot carrier does not occur.

As described above, in the case that a dummy word line and a selected word line are spaced apart from each other, the nonvolatile memory device in accordance with example embodiments of the inventive concept applies a voltage blocking a channel formation to the dummy word line, thereby preventing a disturbance due to a hot carrier.

In FIGS. 5 and 6, example embodiments in accordance with the inventive concept were described using the first dummy memory cell (DMC1) connected to a ground select transistor (GST). This is an illustrative example and a same principle may be applied to a second dummy memory cell (DMC2) connected to a string select transistor (SST).

Figure 7:
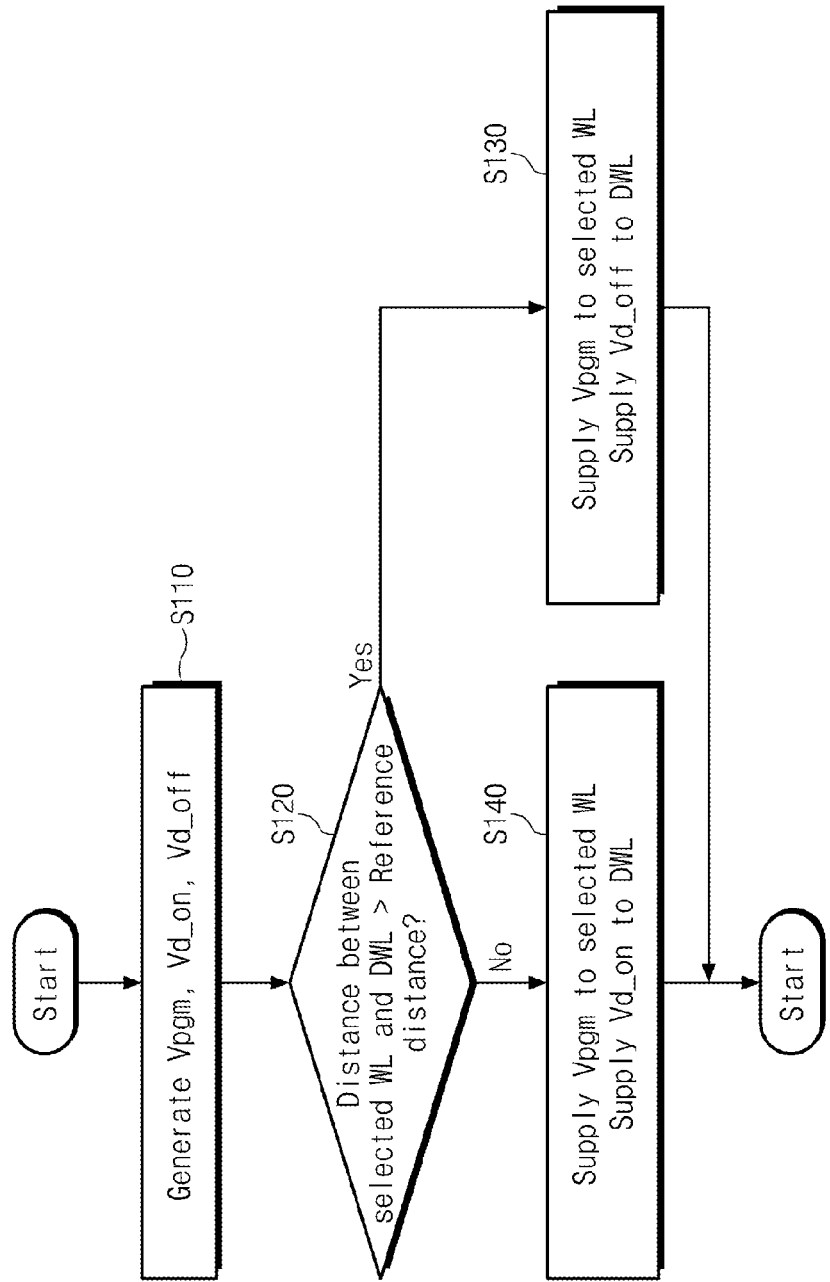
FIG. 7 is a flow chart illustrating an operation of the nonvolatile memory device illustrated in FIGS. 3 through 6.

FIG. 7 is a flow chart illustrating an operation of the nonvolatile memory device illustrated in FIGS. 3 through 6.

In a step of S110, a program voltage Vpgm, a disturbance prevention voltage Vd_on and a disturbance prevention voltage Vd_off are generated.

Referring to FIG. 4, the disturbance prevention voltage Vd_on corresponds to the first disturbance prevention voltage Vd1 for forming a channel between a source and a drain of the first dummy memory cell (DMC1). Referring to FIG. 6, the disturbance prevention voltage Vd_off corresponds to the fourth disturbance prevention voltage Vd4 for blocking a channel between a source and a drain of the first dummy memory cell (DMC1). The program voltage Vpgm, the disturbance prevention voltage Vd_on and the disturbance prevention voltage Vd_off may be generated by the voltage generator 130 of FIG. 1.

In step of S120, it is judged whether or not a distance between a selected word line and a dummy word line is greater than the reference distance.

In the case that a distance between a selected word line and a dummy word line is greater than the reference distance, the program voltage Vpgm is provided to the selected word line and the disturbance prevention voltage Vd_off is provided to the dummy word line (S130). That is, referring to FIG. 6, the program voltage Vpgm is provided to the fourth word line (WL4) and the fourth disturbance prevention voltage Vd4 for blocking a channel formation is provided to the first dummy word line (DWL1).

In the case that a distance between a selected word line and a dummy word line is smaller than the reference distance, the program voltage Vpgm is provided to the selected word line and the disturbance prevention voltage Vd_on is provided to the dummy word line (S140). That is, referring to FIG. 4, the program voltage Vpgm is provided to the first word line (WL1) and the first disturbance prevention voltage Vd1 for forming a channel formation is provided to the first dummy word line (DWL1).

As described above, the nonvolatile memory device in accordance with example embodiments of the inventive concept compares a distance between a selected word line and a dummy word line with the reference distance and can determine a level of a disturbance prevention voltage provided to the dummy word line on the basis of the comparison result.

The foregoing description is an illustrative example, and the inventive concept is not limited thereto. Referring to FIG. 2, it is assumed that a program is performed from the 1st word line (WL1) to the 32th word lien (WL32). In this case, a distance between the selected word line to which the program voltage Vpgm is provided and the first dummy word line (DWL1) sequentially increases. In this case, according to example embodiments of the inventive concept, a voltage provided to the first dummy word line (DWL1) may be sequentially reduced.

Figure 8:
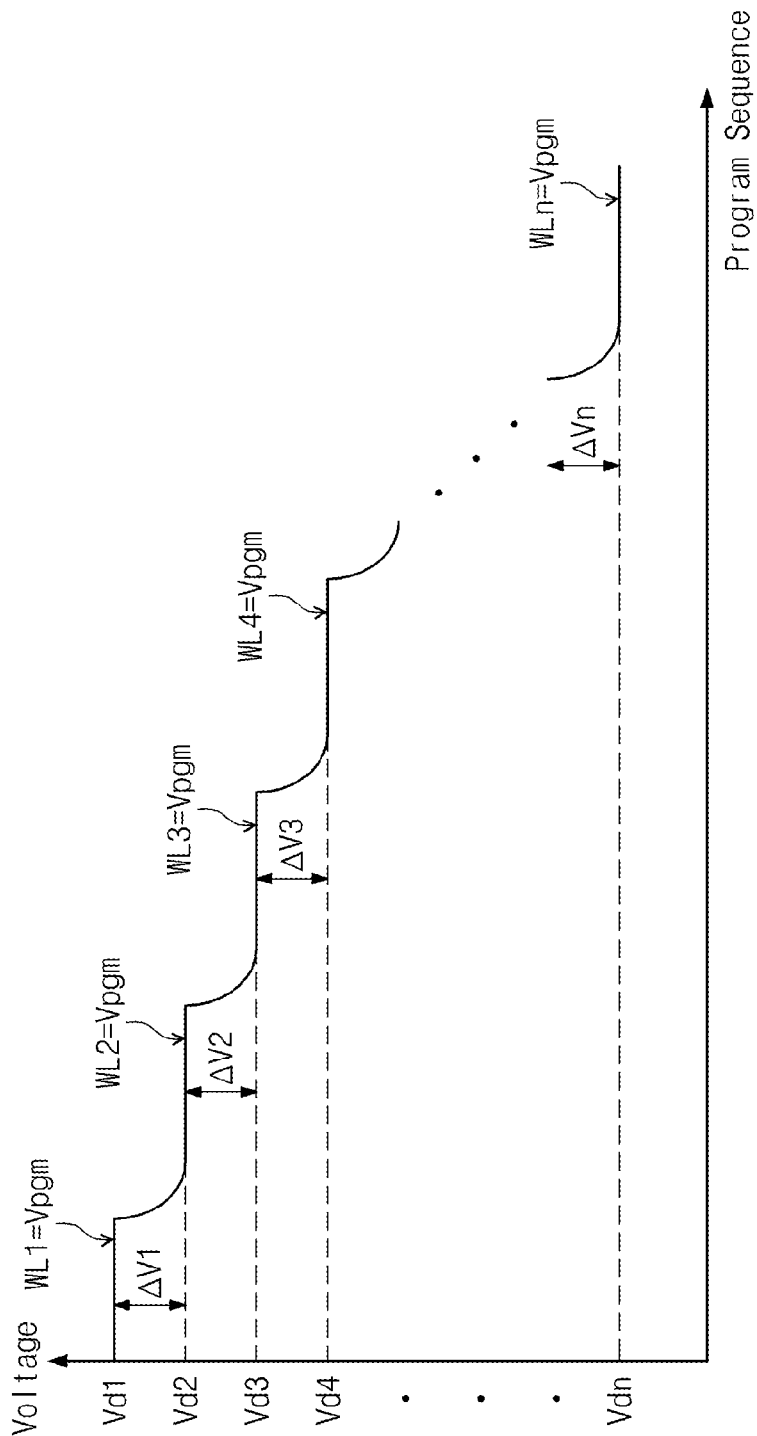
FIG. 8 is a drawing illustrating a change of a disturbance prevention voltage in accordance with another example embodiment of the inventive concept.

FIG. 8 is a drawing illustrating a change of a disturbance prevention voltage in accordance with another example embodiment of the inventive concept. In FIG. 8, a horizontal axis represents a program sequence and a vertical axis represents a disturbance prevention voltage provided to a dummy word line. For convenience of description, referring to FIG. 2, it is assumed that a program is performed from the 1st word line (WL1) to the 32nd word line (WL32). Also, it is assumed that a disturbance prevention voltage Vd provided to the first dummy word line (DWL1) is controlled.

Referring to FIGS. 2 and 8, in the case that the program voltage Vpgm is provided to the first word line (WL1), the first disturbance prevention voltage Vd1 is provided to the first dummy word line (DWL1). Since a distance between the first dummy word line (DWL1) and the first word line (WL1) is small, the first disturbance prevention voltage Vd1 may form a channel in the first dummy memory cell (DMC1). In the case that the program voltage Vpgm is provided to the second word line (WL2), the second disturbance prevention voltage Vd2 is provided to the first dummy word line (DWL1). In this case, a distance between the first dummy word line (DWL1) and the second word line (WL2) is greater than a distance between the first dummy word line (DWL1) and the first word line (WL1). Thus, a voltage lower than the first disturbance prevention voltage Vd1 is provided to the first dummy word line (DWL1). Referring to FIG. 8, a level of the second disturbance prevention voltage Vd2 is lower than the first disturbance prevention voltage Vd1 by ΔV1.

Similarly, in the case that the program voltage Vpgm is provided to the third word line (WL3), the third disturbance prevention voltage Vd3 is provided to the first dummy word line (DWL1). In this case, a level of the third disturbance prevention voltage Vd3 is lower than the second disturbance prevention voltage Vd2 by ΔV2.

Consequently, as the selected word line to which the program voltage Vpgm is provided is further away from the first dummy word line (DWL1), a level of disturbance prevention voltage Vd provided to the first dummy word line (DWL1) becomes lower.

FIGS. 9A-9D are cross-sectional views illustrating a change of a disturbance prevention voltage of FIG. 8. Hereinafter, referring to FIGS. 9A through 9C, a change of a disturbance prevention voltage of FIG. 8 will be described in detail.

Figure 9A:
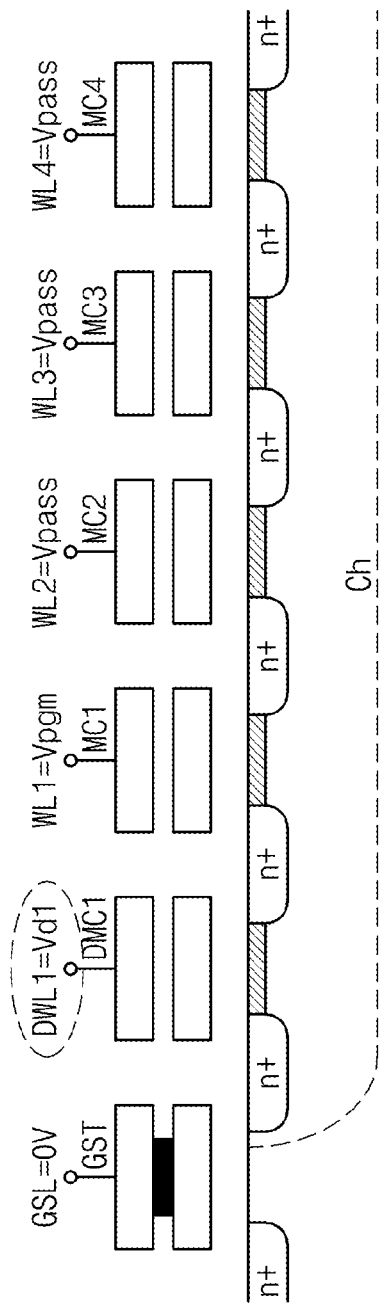
FIG. 9A illustrates a voltage provided to a first dummy word line when a program voltage is provided to a first word line.

FIG. 9A illustrates a voltage provided to a first dummy word line when a program voltage is provided to a first word line. In this case, it is assumed that a first memory cell MC1 is a memory cell to be program-inhibited that shares a first word line (WL1) with a selected memory cell.

Referring to FIG. 9A, in the case that the program voltage Vpgm is provided to the first word line (WL1), the first memory cell (MC1) is adjacent to a first dummy memory cell (DMC1). Thus, a first disturbance prevention voltage Vd1 for forming a channel in the first dummy memory cell (DMC1) is provided to a first dummy memory cell (DMC1). A level of the first disturbance prevention voltage Vd1 may correspond to a level of the first disturbance prevention voltage Vd1 of FIG. 8.

Figure 9B:
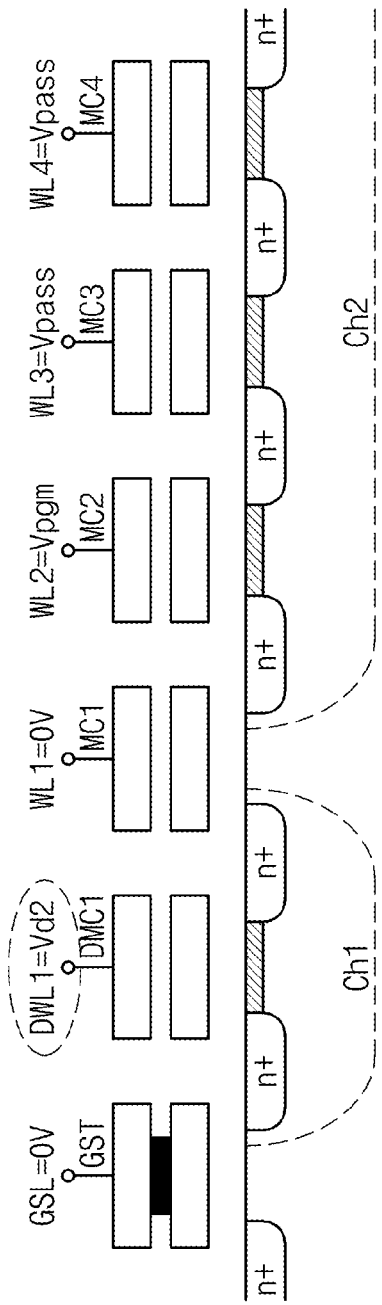
FIG. 9B illustrates a voltage provided to a first dummy word line when a program voltage is provided to a second word line.

FIG. 9B illustrates a voltage provided to a first dummy word line when a program voltage is provided to a second word line. In this case, it is assumed that a second memory cell MC2 is a memory cell to be program-inhibited that shares a second word line (WL2) with a selected memory cell. Also, it is assumed that a ground voltage 0V is provided to the first word line (WL1) by a local boosting scheme and thereby a first channel Ch1 and a second channel Ch2 are formed.

Referring to FIG. 9B, in the case that the program voltage Vpgm is provide to the second word line (WL2), the second memory cell MC2 is further spaced apart from the first dummy memory cell (DMC1) compared with the first memory cell (MC1). A second disturbance prevention voltage Vd2 lower than the first disturbance prevention voltage Vd1 is provided to a first dummy word line (DWL1). The second disturbance prevention voltage Vd2 may correspond to the second disturbance prevention voltage Vd2 of FIG. 8.

Figure 9C:
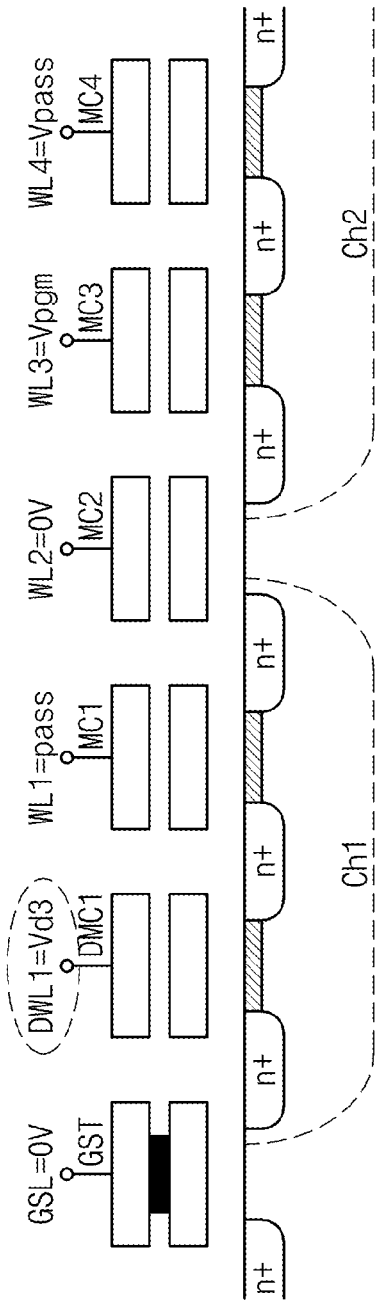
FIG. 9C illustrates a voltage provided to a first dummy word line when a program voltage is provided to a third word line.
Figure 9D:
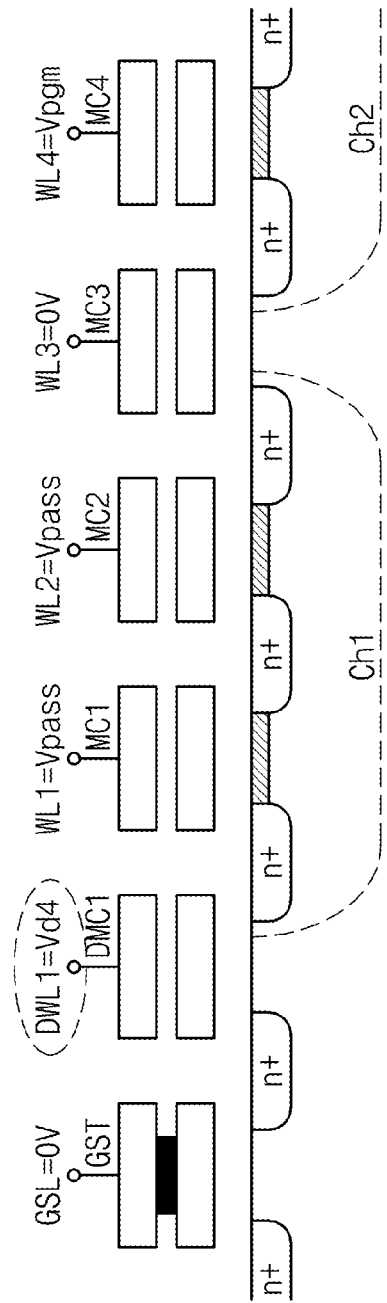
FIG. 9D illustrates a voltage provided to a first dummy word line when a program voltage is provided to a fourth word line.

FIG. 9C illustrates a voltage provided to a first dummy word line when a program voltage is provided to a third word line. FIG. 9D illustrates a voltage provided to a first dummy word line when a program voltage is provided to a fourth word line.

Referring to FIGS. 9C and 9D, in the case that the program voltage Vpgm is provide to the third word line (WL3), the third memory cell MC3 is further spaced apart from the first dummy memory cell (DMC1) compared with the second memory cell (MC2). Similarly, in the case that the program voltage Vpgm is provide to the fourth word line (WL4), the fourth memory cell MC4 is further spaced apart from the first dummy memory cell (DMC1) compared with the third memory cell (MC3).

Thus, in the case of FIG. 9C, a third disturbance prevention voltage Vd3 is provided to the first dummy word line (DWL1) and in the case of FIG. 9D, a fourth disturbance prevention voltage Vd4 is provided to the first dummy word line (DWL1).

In FIGS. 8 and 9A-9D, example embodiments of the inventive concept were described using the first dummy memory cell (DMC1) connected to a ground select transistor (GST). However, this is only an illustrative example and a same principle may be applied to a second dummy memory cell (DMC2) connected to a string select transistor (SST).

Figure 10:
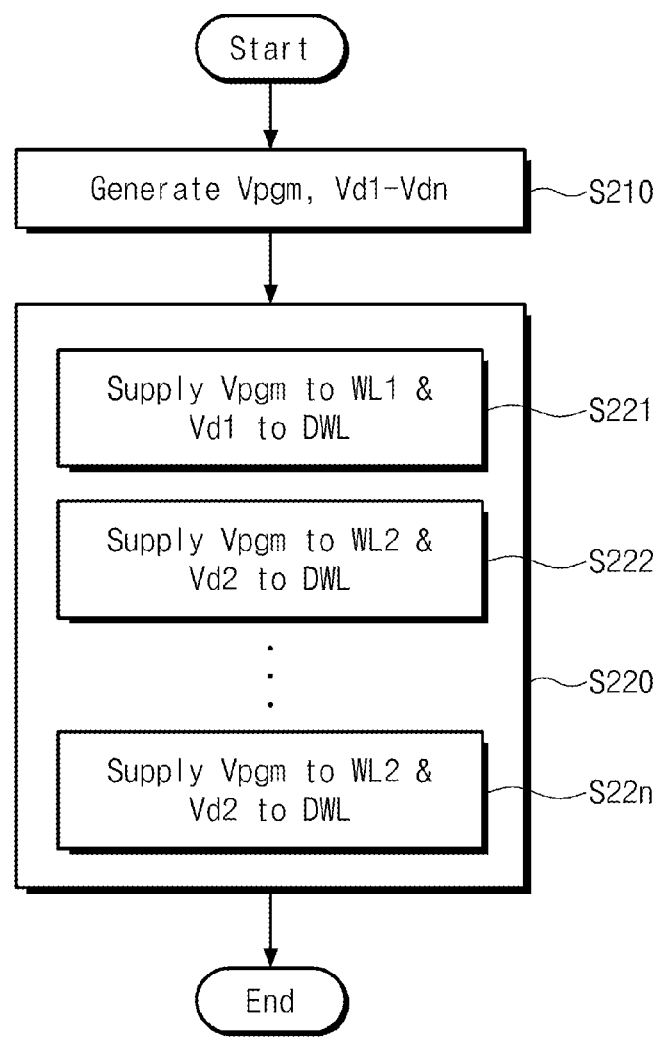
FIG. 10 is a flow chart illustrating an operation of a nonvolatile memory device in accordance with an example embodiment of the inventive concept described in FIGS. 8 and 9.

FIG. 10 is a flow chart illustrating an operation of a nonvolatile memory device in accordance with an embodiment of the inventive concept described in FIGS. 8 and 9A-9D.

In a step of S210, a program voltage Vpgm and 1st through nth disturbance prevention voltages Vd1-Vdn are generated. Referring to FIG. 8, the 1st through nth disturbance prevention voltages Vd1-Vdn may be a voltage level that is sequentially reduced.

In a step of S220, a disturbance prevention voltage Vd corresponding to a selected word line to which the program voltage Vpgm is provided to the dummy word line (DWL).

Referring to FIGS. 2 and 8, in the case that the program voltage Vpgm is provided to the first word line (WL1), the first disturbance prevention voltage Vd1 is provided to the first dummy word line (DWL1) (S221). In the case that the program voltage Vpgm is provided to the second word line (WL2), the second disturbance prevention voltage Vd2 is provided to the first dummy word line (DWL1) (S222). In the case that the program voltage Vpgm is provided to the nth word line (WLn), the nth disturbance prevention voltage Vdn is provided to the first dummy word line (DWL1) (S223).

As described above, the nonvolatile memory device in accordance with exemplary embodiments of the inventive concept properly controls a level of the disturbance prevention voltage Vd provided to the dummy word line (DWL) according to a location of selected word line when a program operation is performed. Thus, the nonvolatile memory device can prevent a disturbance due to a hot carrier.

In FIGS. 2 through 10, the inventive concept was described using a two-dimensional memory cell array circuit. However, the inventive concept is not limited to a two-dimensional memory cell array circuit. The memory cell array 110 of FIG. 1 may be a three-dimensional memory cell array and the inventive concept may be applied to a three-dimensional memory cell array.

Figure 11:
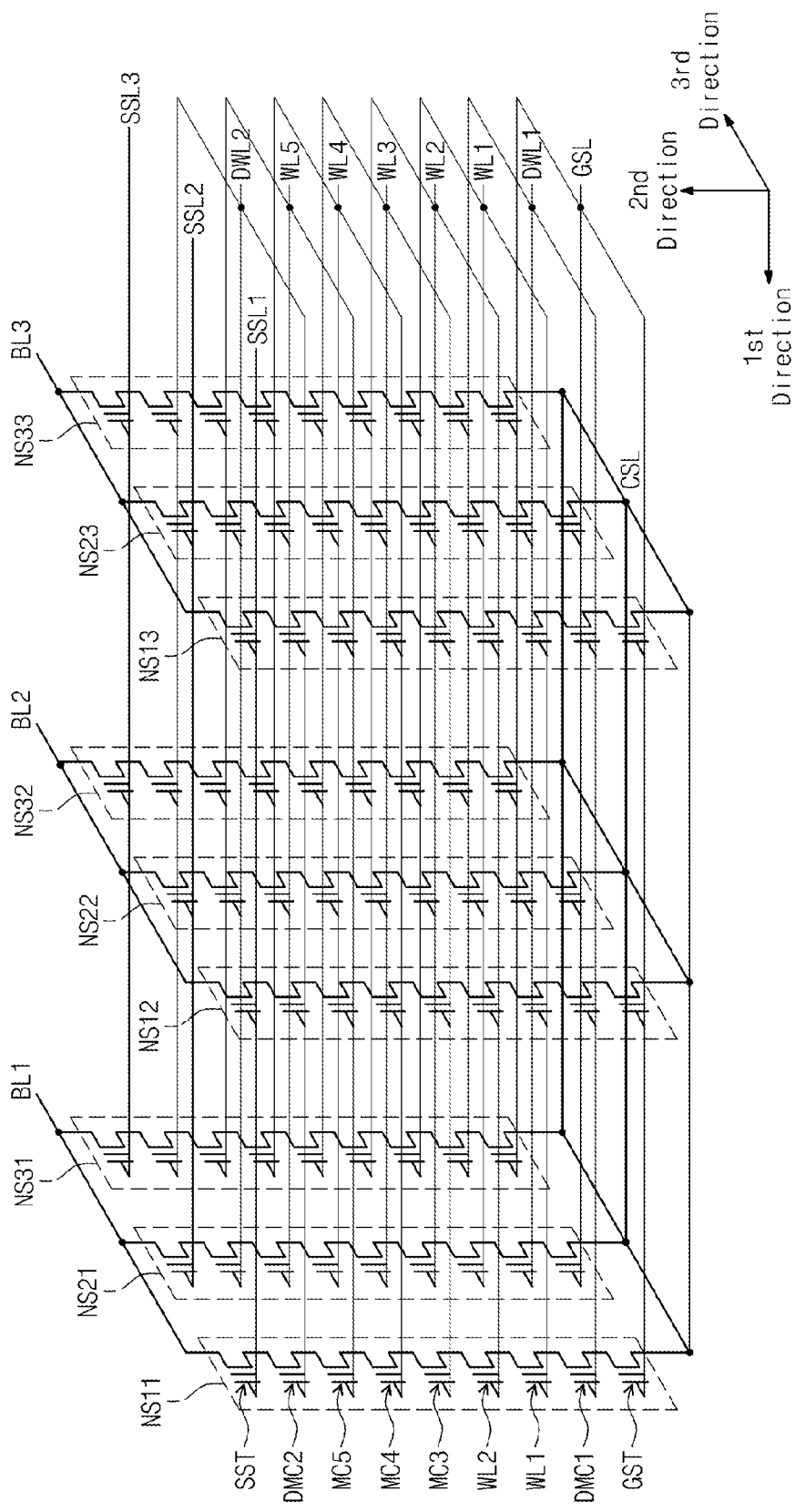
FIG. 11 is a drawing illustrating a memory cell array of FIG. 1 in accordance with another example embodiment of the inventive concept.

FIG. 11 is a drawing illustrating a memory cell array 110 of FIG. 1 in accordance with another example embodiment of the inventive concept. In FIG. 11, unlike FIG. 2, it is assumed that the memory cell array 110 is a three-dimensional memory cell array.

Referring to FIG. 11, NAND strings NS11-NS31 are electrically connected to one another between a first bit line (BL1) and a common source line (CSL). Similarly, NAND strings NS12-NS32 are electrically connected to one another between a second bit line (BL2) and the common source line (CSL). NAND strings NS13-NS33 are electrically connected to one another between a third bit line (BL3) and the common source line (CSL). The first through third bit lines BL1-BL3 extend in a 3rd direction and are disposed side by side along a 1st direction.

Each of NAND strings NS may include a string select transistor (SST), memory cells (MC), dummy memory cells (DMC) and a ground select transistor (GST). Gates of memory cells disposed on a same layer are electrically connected to a word line extending in the 1st direction. Also, gates of dummy memory cells disposed on a same layer are electrically connected to a dummy word line extending in the 1st direction.

As described above, the nonvolatile memory device in accordance with example embodiments of the inventive concept includes a three-dimensional memory cell array. In this case, the nonvolatile memory device properly controls a level of the disturbance prevention voltage Vd provided to the dummy word line (DWL) according to a location of selected word line when a program operation is performed. Since this is similar to the operation of the nonvolatile memory device including the two-dimensional memory cell array described in FIGS. 2 through 9D, a detailed description is omitted. Thus, the nonvolatile memory device in accordance with example embodiments of the inventive concept can prevent a disturbance due to a hot carrier.

Figure 12:
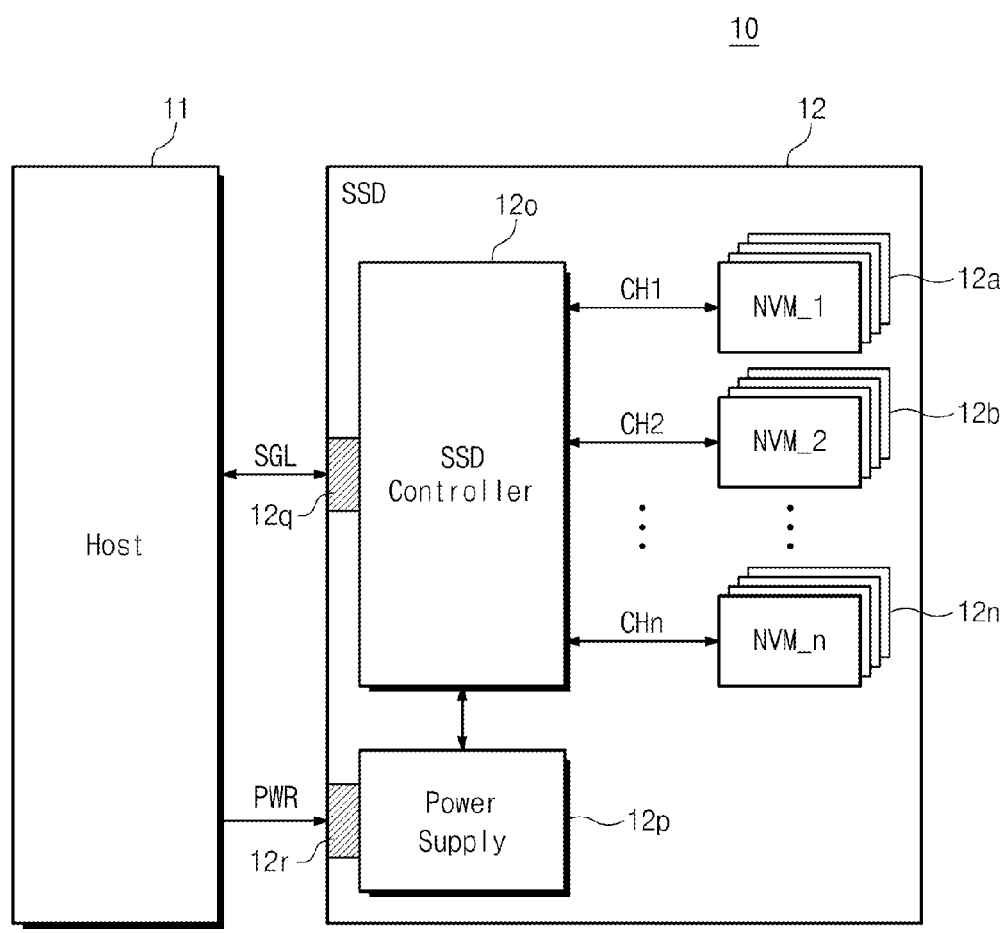
FIG. 12 is a block diagram illustrating a solid state disk (SSD) including a nonvolatile memory device of FIG. 1.

FIG. 12 is a block diagram illustrating a solid state disk (SSD) including a nonvolatile memory device of FIG. 1. Referring to FIG. 12, solid state disk (SSD) system 10 includes a host 11 and a SSD 12. The SSD 12 exchanges signals with the host 11 through a signal connector 12q and receives a power supply through a power connector 12r. The SSD 12 includes a plurality of nonvolatile memory devices 12a-12n, a SSD controller 12o and an auxiliary power supply 12p.

The plurality of nonvolatile memory devices 12a-12n is used as a storage medium. The plurality of nonvolatile memory devices 12a-12n may be embodied by a flash memory device having a mass storage capacity. The SSD 12 mainly uses a flash memory but besides a flash memory, a nonvolatile memory device such as a FRAM, a MRAM, a ReRAM, a FRAM, etc. may be used as the SSD 12.

In FIG. 12, at least one nonvolatile memory device may include the nonvolatile memory device 100 illustrated in FIG. 1. That is, the nonvolatile memory device illustrated in FIG. 12 can prevent a disturbance due to a hot carrier by properly controlling a level of a disturbance prevention voltage Vd provided to a dummy word line DWL according to a location of a selected word line when a program operation is performed.

The plurality of nonvolatile memory devices 12a-12n may be connected to the SSD controller 12o through a plurality of channels CH1-CHn. One or more memory devices may be connected to one channel. Memory devices connected to one channel may be connected to a same data bus.

The SSD controller 12o exchanges signals with the host 11 through the signal connector 12q. Here, the signals may include a command, an address, data, etc. The SSD controller 12o writes data in a corresponding memory device or reads data from a corresponding memory device according to a command of the host 11.

The auxiliary power supply 12p is connected to the host 11 through the power connector 12r. The auxiliary power supply 12p receives a power from the host 11, and then can be charged. The auxiliary power supply 12p may be disposed inside the SSD 12 or outside the SSD 12. For example, the auxiliary power supply 12p may be disposed at a main board and may provide an auxiliary power to the SSD 12.

Figure 13:
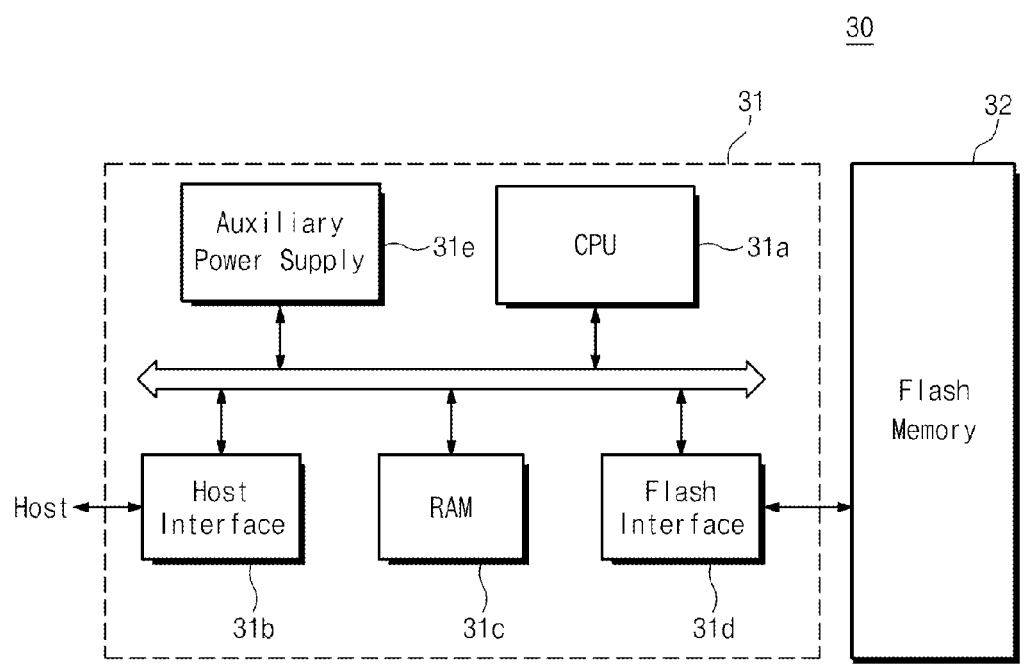
FIG. 13 is a block diagram illustrating a data storage device including a nonvolatile memory device in accordance with example embodiments of the inventive concept.

FIG. 13 is a block diagram illustrating a data storage device including a nonvolatile memory device in accordance with example embodiments of the inventive concept. Referring to FIG. 13, a data storage device 30 includes a memory controller 31 and a flash memory 32. The data storage device 30 includes a storage medium such as a memory card (e.g., SD, MMC, etc.) or a removable mobile storage device (e.g., USB memory, etc.).

Referring to FIG. 13, the memory controller 31 includes a central processing unit (CPU) 31a, a host interface 31b, a random access memory (RAM) 31c, a flash interface 31d and an auxiliary power supply 31e. The auxiliary power supply 31e may be disposed inside the memory controller 31 or outside the memory controller 31.

The data storage device 30 is used to be connected to a host. The data storage device 30 exchanges data with the host through the host interface 31b and exchanges data with the flash memory 32 through the flash interface 31d. The data storage device 30 receives a power supply from the host to perform an internal operation.

The flash memory 32 illustrated in FIG. 13 may be the nonvolatile memory device illustrated in FIG. 1. That is, the nonvolatile memory device illustrated in FIG. 13 can prevent a disturbance due to a hot carrier by properly controlling a level of a disturbance prevention voltage Vd provided to a dummy word line DWL according to a location of a selected word line when a program operation is performed.

Figure 14:
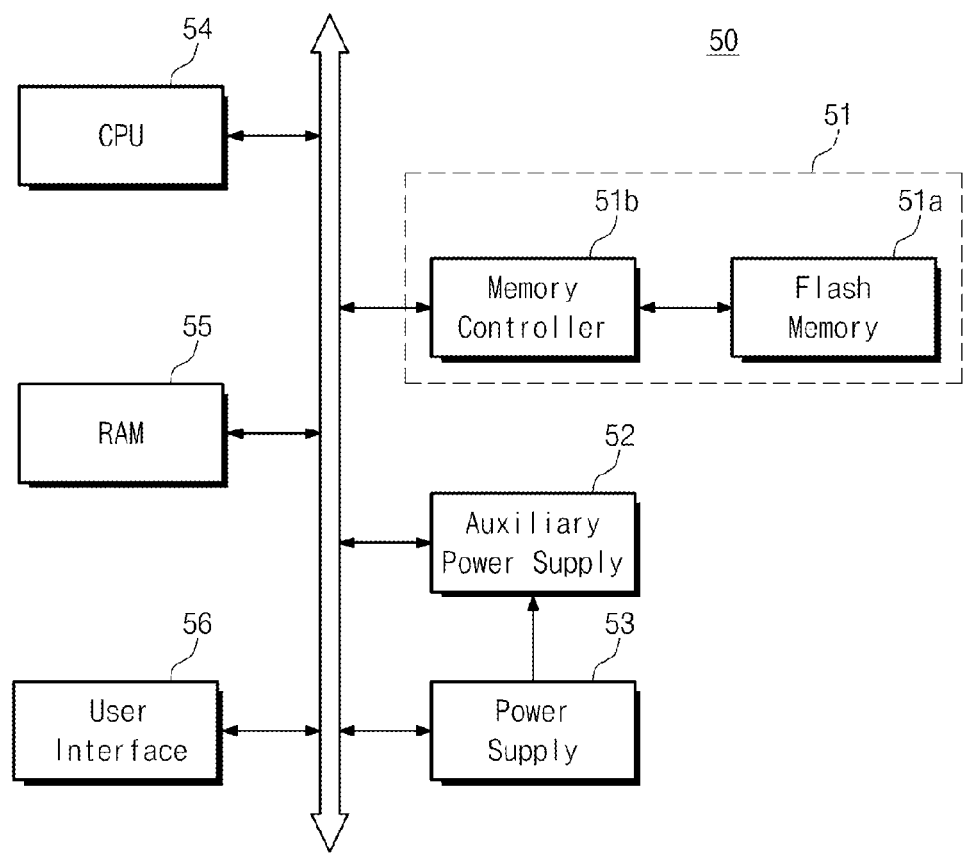
FIG. 14 is a block diagram illustrating an electronic device including a nonvolatile memory device in accordance with example embodiments of the inventive concept.

FIG. 14 is a block diagram illustrating an electronic device including a nonvolatile memory device in accordance with example embodiments of the inventive concept. The electronic device 50 may be embodied by a personal computer (PC) or a portable electronic device such as a notebook computer, a cell phone, a personal digital assistant (PDA) and a camera.

Referring to FIG. 14, the electronic device 50 includes a semiconductor memory device 51, a power supply 53, an auxiliary power supply 52, a central processing unit (CPU) 54, a random access memory (RAM) 55 and a user interface 56. The semiconductor memory device 51 includes a flash memory 51a and a memory controller 51b.

The flash memory 51a illustrated in FIG. 14 may be the nonvolatile memory device illustrated in FIG. 1. That is, the nonvolatile memory device illustrated in FIG. 14 can prevent a disturbance due to a hot carrier by properly controlling a level of a disturbance prevention voltage Vd provided to a dummy word line DWL according to a location of a selected word line when a program operation is performed.

The foregoing description is an illustrative example, and the inventive concept should not be limited thereto. For example, in the foregoing description, it was assumed that one dummy memory cell is connected to a ground select transistor and a string select transistor. In an alternative example embodiment, at least two dummy memory cells may be serially connected to a ground select transistor and a string select transistor.

According to example embodiments of the inventive concept, a disturbance phenomenon due to a hot carrier may be prevented. As a result, reliability of nonvolatile memory device may be improved.

Although the inventive concept has been described in connection with the example embodiments illustrated in the accompanying drawings, it should not be limited thereto. It will be apparent to those skilled in the art that various substitutions, modifications and changes may be made thereto without departing from the scope and spirit of the inventive concept.

What is claimed is:

1. A nonvolatile memory device having a string structure, comprising:
   a dummy memory cell; and a plurality of memory cells serially connected to the dummy memory cell, wherein a voltage applied to the dummy memory cell during a programming operation is set according to a distance between the dummy memory cell and a memory cell selected from the plurality of memory cells for programming, and wherein a plurality of n voltage levels are selectively applied to the dummy memory cell as the voltage and are decreased as the distance between the memory cell selected for programming and the dummy memory cell is increased, wherein n is greater than 2, and wherein the voltage levels do not increase as the distance increases beyond n greater than 2.

2. The nonvolatile memory device of claim 1, further comprising a voltage generator configured to generate the plurality of n voltages levels applied to the dummy memory cell and to generate first voltages applied to the plurality of memory cells.

3. A nonvolatile memory device, comprising:

a ground select transistor;

a dummy memory cell serially connected to the ground select transistor and configured to receive a disturbance prevention voltage via a dummy word line; and first, second and third memory cells serially connected to the dummy memory cell and configured to form a channel according to voltages received via respective first, second and third word lines, wherein during a program operation, the disturbance prevention voltage applied to the dummy memory cell is set according to a distance between the dummy memory cell and a memory cell selected from the first, second and third memory cells for programming, wherein a distance between the first memory cell and the dummy memory cell is a first distance, a distance between the second memory cell and the dummy memory cell is a second distance, and a distance between the third memory cell and the dummy memory cell is a third distance, wherein the third distance is longer than the second distance, and the second distance is longer than the first distance, wherein a first disturbance prevention voltage applied to the dummy word line when the first memory cell is selected for programming is greater than a second disturbance prevention voltage applied to the dummy word line when the second memory cell is selected for programming, and the second disturbance prevention voltage is greater than a third disturbance prevention voltage applied to the dummy word line when the third memory cell is selected for programming, and wherein when memory cells serially connected beyond the third memory cell are selected for programming, disturbance prevention voltages applied to the dummy word line do not increase.

4. The nonvolatile memory device of claim 3, further comprising a voltage generator configured to generate the disturbance prevention voltages applied to the dummy memory cell and to generate voltages applied to the first and second memory cells.

5. A nonvolatile memory device comprising:

a plurality of memory cells configured to form a channel responsive to first voltages received via respective word lines;

a dummy memory cell serially connected between a ground select transistor and the plurality of memory cells, and configured to receive a disturbance prevention voltage via a dummy word line; and a voltage generator configured to generate the first voltages and a plurality of n voltage levels, selectively apply the plurality of n voltage levels as the disturbance prevention voltage to the dummy memory cell via the dummy word line, and apply the first voltages to the plurality of memory cells via the respective word lines, the voltage generator preventing unselected memory cells from being programmed by setting the disturbance prevention voltage according to a distance between the dummy memory cell and a memory cell selected for programming, wherein the plurality of n voltage levels applied to the dummy memory cell as the disturbance prevention voltage are decreased as the distance between the selected memory cell and the dummy memory cell is increased, and wherein n is greater than 2, and wherein the voltage levels do not increase as the distance increases beyond n greater than 2.

* * * * *